United States Patent
An

[11] Patent Number: 6,153,538
[45] Date of Patent: Nov. 28, 2000

[54] METHOD OF MAKING MOSFET WITH ULTRA-THIN GATE OXIDE

[75] Inventor: Judy X. An, San Jose, Calif.

[73] Assignee: Advanced Micro Devices, Inc., Sunnyvale, Calif.

[21] Appl. No.: 09/303,627

[22] Filed: May 3, 1999

[51] Int. Cl.[7] ................................................. H01L 21/469
[52] U.S. Cl. .............................................. 438/766; 438/659
[58] Field of Search .................................... 438/766, 494, 438/962, 300, 664, 659, 685; 148/187; 29/571, 578

[56] References Cited

U.S. PATENT DOCUMENTS

| | | | |
|---|---|---|---|
| 3,798,752 | 3/1974 | Fujimoto | 29/571 |
| 4,356,041 | 10/1982 | Kosa | 148/187 |
| 5,880,012 | 3/1999 | Ha et al. | 438/494 |
| 5,885,877 | 3/1999 | Gardner et al. | 438/300 |
| 5,960,319 | 9/1999 | Iwata et al. | 438/664 |

*Primary Examiner*—David Nelms
*Assistant Examiner*—Phuc T. Dang

[57] ABSTRACT

A semiconductor device comprising a miniaturized transistor with high-speed performance is formed with an ultra thin gate oxide layer. The ultra thin gate oxide layer is formed retarding its growth on a nitrogen-rich silicon substrate. Embodiments include ion implanting impurity to displace nitrogen atoms from a nitride layer on the substrate and to force the displaced nitrogen atoms into the surface portion of the semiconductor substrate. The nitrogen atoms retard the growth of the gate oxide layer, thereby enabling formation of an ultra thin gate oxide.

11 Claims, 1 Drawing Sheet

METHOD OF MAKING MOSFET WITH ULTRA-THIN GATE OXIDE

FIELD OF THE INVENTION

The present invention relates generally to a semiconductor device comprising transistors, and to a method of manufacturing the semiconductor device. This invention has particular applicability in manufacturing a high-density Metal Oxide Semiconductor Field Effect Transistor (MOSFET) device for high-speed performance.

BACKGROUND ART

The growth of the gate oxide layer is a critical step in manufacturing semiconductor devices, particularly miniaturized semiconductor devices. Thin gate oxide layers free of defects and of high quality without contamination are essential for proper device operation. As design rules shrink to the submicron range for ultra large-scale integrated circuit (ULSI) semiconductor device, it becomes increasingly vital to grow gate oxides on crystalline silicon at a reduced thickness with good electrical characteristics and long-term reliability in a repeatable manner. Various oxidation techniques have been developed and practiced, including dry oxidation, dry oxidation with HCl, sequential oxidation using different temperatures and ambients, wet oxidation, deduced pressure techniques, and high pressure/low temperature oxidation. The drain current in a MOS transistor is inversely proportional to the gate oxide thickness. However, it is extremely difficult to form a gate oxide layer with a reduced thickness, e.g., about 15 Å to about 30 Å with higher oxide breakdown and higher reliability.

Therefore, there exists a need for an efficient and production worthy method for manufacturing semiconductor devices comprising transistors with very a thin gate oxide.

DISCLOSURE OF THE INVENTION

An advantage of the present invention is an efficient and production worthy methodology for manufacturing a high-density semiconductor device designed for high-speed performance.

Additional advantages and other features of the present invention will be set forth in part in the description which follows and in part will become apparent to those having ordinary skill in the art upon examination of the following description or may be learned from the practice of the present invention. The objectives and advantages of the present invention maybe realized and obtained as particularly pointed out in the appended claims.

According to the present invention, the foregoing and other advantages are achieved in part by a method of manufacturing semiconductor device, the method comprising: forming a nitride layer on a main surface of a semiconductor substrate or a well region formed in the semiconductor substrate; ion implanting atoms into a portion of the nitride layer to displace nitrogen atoms from the nitride layer into a portion of the underlying main surface; removing the nitride layer; and thermally oxidizing to form a gate oxide layer on the nitrogen containing main surface portion, wherein the nitrogen atoms in the main surface portion retard the growth of the gate oxide layer thereon.

Additional advantages of the present invention will become readily apparent to those skilled in the art from the following detailed description, wherein only the preferred embodiment of the present invention is shown and described, simply by way of illustrating the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature and not restrictive.

BRIEF DESCRIPTION OF DRAWINGS

In FIG. 1 to FIG. 5, similar features are denoted by similar reference numerals.

DESCRIPTION OF INVENTION

The present invention enables efficient manufacturing of semiconductor devices having an ultra-thin gate oxide layer, e.g., a thickness significantly smaller than the minimum limit of conventional gate oxide thickness, thereby achieving manufacturing semiconductor device with increased densification and high speed performance.

Figure 1:
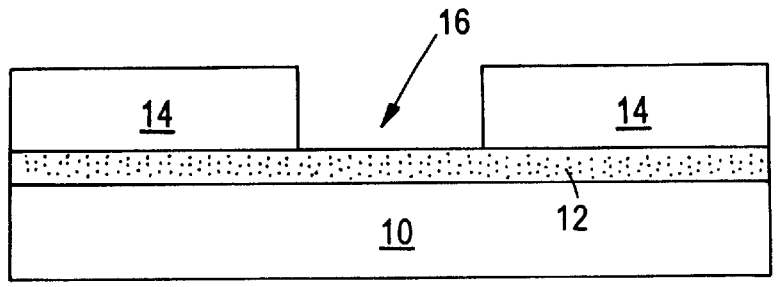
FIG. 1 to FIG. 5 illustrate sequential phases of a method according to an embodiment of the present invention.

The present invention achieves that objective by forming a nitrogen region at the main surface of the semiconductor substrate. Embodiments of the present invention include forming the nitrogen region by displacing nitrogen atoms from a nitrogen layer formed on the main surface of the semiconductor substrate, and propelling the displaced nitrogen atoms into the underlying main surface of the semiconductor substrate. An embodiment of a method in accordance with the present invention is schematically illustrated commencing with intermediate fabrication stage as shown in FIG. 1. Nitride layer 12, e.g., a silicon nitride layer, is formed as at a suitable thickness, e.g., about 100 Å to 200 Å, as by conventional chemical vapor deposition, on the main surface of semiconductor substrate 10. After forming the nitrogen layer, mask layer 14, e.g., a photoresist (PR) layer, is formed on the nitride layer 12, patterned and etched by conventional photolithographic and etching techniques to form a mask defining opening 16.

Figure 2:
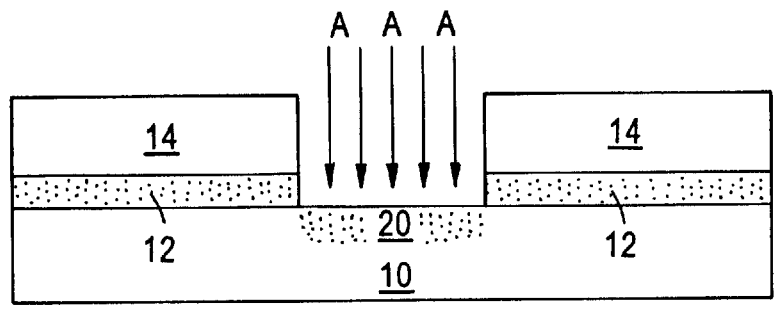

As shown in FIG. 2, the nitrogen atoms in the silicon nitride layer 12 are displaced and forced into the surface portion of the semiconductor substrate 10 underlying the opening 16, thereby forming nitrogen-rich region 20. In this embodiment, the nitrogen atoms are "knocked off" and pushed into the surface portion of the semiconductor substrate 10 as by ion implanting atoms, e.g., boron difluride ($BF_2$) atoms at an implantation dosage of about $1\times10^{12}$ atoms $cm^{-2}$ to about $1\times10^{13}$ atoms $cm^{-2}$ and at an implantation dosage of about 20K eV to 35K eV, as shown by arrows A, employing the mask layer 14 as a mask. Other suitable atoms can be employed to displace the nitrogen atoms, e.g., arsenic, phosphors or boron. The implanted $BF_2$ atoms enter the silicon nitride crystal lattice of the silicon nitride layer 12 and collide with the nitrogen atoms, thereby displacing the nitrogen atoms. The "knocked off" nitrogen atoms are then pushed into the surface portion of the semiconductor substrate 10 underlying the opening 16, thereby forming nitrogen-rich region 20. The "knocked off" portion of the silicon nitride layer 12 is then removed from the surface of the semiconductor surface 10, exposing the surface of the nitrogen-rich region 20.

Figure 3:
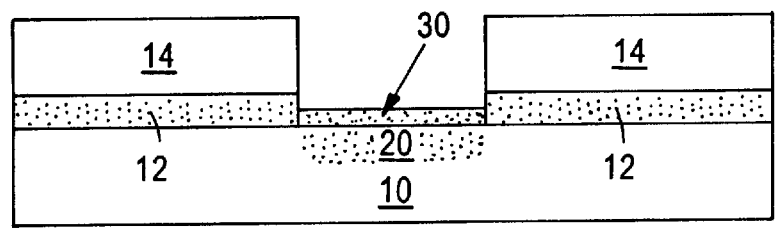

An oxide layer 30 is then formed, as shown in FIG. 3, on the surface of the nitrogen region 20 in the opening 16, as by thermal oxidation, e.g., at a temperature of about 800° C. to about 1000° C. for about 3 minutes to about 10 minutes. The nitrogen-rich region 20 in the surface of the semiconductor surface underlying the opening 16 retards the growth of the oxide layer 30. It is believed that the "knocked off" nitrogen atoms in the nitrogen region 20 restrain the oxidizing species from reaching the silicon substrate 10 during oxidation because oxygen and water vapor diffuse very slowly through the implanted nitrogen. As a result, ultra thin oxide layer 30 is formed on the nitrogen region 20, such as at a thickness of about 10 Å to about 30 Å.

Figure 4:
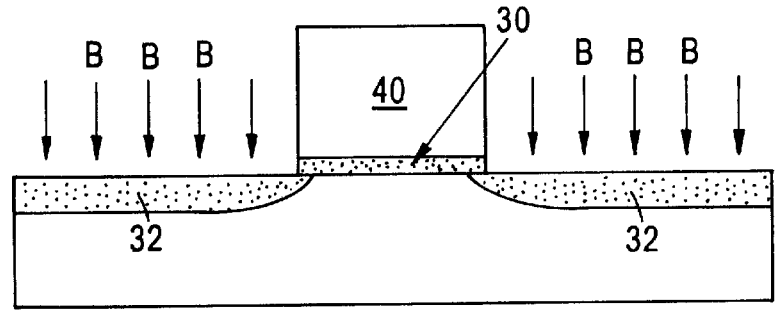
Figure 5:
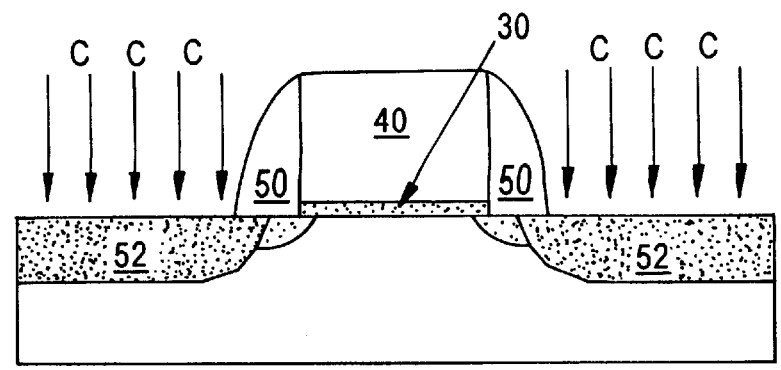

Embodiments of the present invention comprise subsequent processing, as by forming a conductive layer 40 on the thin gate oxide layer 30, as shown in FIG. 4, as by depositing polycrystalline silicon, e.g., chemical vapor deposition to form gate electrode comprising the conductive layer 40 on the thin gate oxide layer 30. Adverting to FIG. 4, the mask layer 14 and silicon nitride layer 12 are then removed from the surface of the semiconductor substrate 10. N-type or p-type impurities are then ion implanted, as shown by arrows B, to form shallow source and drain extensions 32, employing the gate electrode as a mask. Subsequently, as shown in FIG. 5, sidewall spacers 50 are formed on the side surfaces of the gate electrode, and n-type or p-type impurities are ion implanted, as shown by arrows C, to form source/drain regions 52, employing the sidewall spacers 50 and gate electrode.

Thus, by the present invention, a semiconductor device is formed, comprising an ultra thin gate oxide layer thinner than the minimum limit of conventional gate oxide thickness, thereby enabling manufacturing semiconductor devices with high-density and high-speed performance. The inventive method is efficient and production worthy, yielding high-density semiconductor devices with improved performance.

The present invention is applicable to the production of various types of semiconductor devices. The present invention is particularly applicable to high-density semiconductor device having a design rule of about 0.18 microns and under, exhibiting high-speed characteristics and low voltage consumption.

Embodiments of the present invention involve the use of conventional materials and methodologies to form various components of a transistor and semiconductor device. For example, the semiconductor substrate employed in the embodiments of the present invention typically comprises doped monocrystalline silicon, and the sidewall spacers typically comprise silicon oxide or silicon nitride.

In the previous description, numerous specific details are set forth such as specific material, structure, chemicals, process, etc., in order to provide a through understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expresses herein.

What is claimed is:

1. A method of manufacturing a semiconductor device, the method comprising:

forming a nitride layer on a main surface of a semiconductor substrate or a well region formed in the semiconductor substrate;

ion implanting atoms into a portion of the nitride layer to displace nitrogen atoms from the nitride layer into a portion of the underlying main surface;

removing the nitride layer; and thermally oxidizing to form a gate oxide layer on the nitrogen containing main surface portion, wherein the nitrogen atoms in the main surface portion retard the growth of the gate oxide layer thereon.

2. The method according to claim 1, wherein the nitride layer comprises silicon nitride, the method comprising ion implanting boron difluride ($BF_2$) or arsenic to displace the nitrogen atoms.

3. The method according to claim 2, comprising forming the silicon nitride layer at a thickness of about 100 Å to about 200 Å.

4. The method according to claim 2, comprising ion implanting $BF_2$ at an implantation dosage of about $1\times10^{12}$ atoms cm$^{-2}$ to about $1\times10^{13}$ atoms cm$^{-2}$ at an implantation energy of about 20 KeV to about 35 KeV.

5. The method according to claim 1, comprising:

forming a mask on and exposing a portion of the nitride layer; and ion implanting the atoms into the exposed surface portion of the nitride layer.

6. The method according to claim 1, comprising forming the gate oxide layer at a thickness of about 10 Å to about 30 Å.

7. The method according to claim 1, comprising thermally oxidizing at a temperature of about 800° C. to about 1000° C. for about 3 minutes to 10 minutes to form the gate oxide layer.

8. The method according to claim 1, further comprising forming a gate electrode layer on the gate oxide layer.

9. The method according to claim 8, further comprising ion implanting to form source and drain regions.

10. The method according to claim 9, comprising:

ion implanting impurities using the gate electrode and gate oxide as a mask, to form shallow source and drain extensions;

forming sidewall spacers on side surfaces of the gate electrode and the gate oxide layer; and ion implanting impurities, using the gate electrode, gate oxide and sidewall spacers as a mask, to form source and drain regions.

11. The method according to claim 9, comprising implanting impurities, using the gate electrode and gate oxide as a make, to form the source and drain regions.

* * * * *